(12) United States Patent
Suzuki et al.

(10) Patent No.: US 9,194,056 B2
(45) Date of Patent: Nov. 24, 2015

(54) FILM-FORMING APPARATUS AND METHOD

(75) Inventors: Kunihiko Suzuki, Shizuoka (JP); Shinichi Mitani, Shizuoka (JP); Yuusuke Sato, Tokyo (JP)

(73) Assignee: NuFlare Technology, Inc., Shizuoka (JP)

(*) Notice: Subject to any disclaimer, the term of this patent is extended or adjusted under 35 U.S.C. 154(b) by 642 days.

(21) Appl. No.: 13/568,872

(22) Filed: Aug. 7, 2012

(65) Prior Publication Data

US 2013/0036968 A1  Feb. 14, 2013

(30) Foreign Application Priority Data

Aug. 8, 2011 (JP) .................................. 2011-173086

(51) Int. Cl.
*C30B 23/02* (2006.01)
*C30B 29/06* (2006.01)
*C30B 25/12* (2006.01)
*C23C 16/44* (2006.01)
*C23C 16/455* (2006.01)

(52) U.S. Cl.
CPC ............. *C30B 29/06* (2013.01); *C23C 16/4411* (2013.01); *C23C 16/45565* (2013.01); *C23C 16/45589* (2013.01); *C30B 25/12* (2013.01)

(58) Field of Classification Search
CPC ........ C30B 23/02; C30B 23/06; C30B 25/14; C30B 25/10
See application file for complete search history.

(56) References Cited

FOREIGN PATENT DOCUMENTS

| JP | 2-122076 |   | 5/1990 |
| JP | 05-206047 | * | 1/1992 |
| JP | 11-54496 |   | 2/1999 |
| JP | 2008-108983 |   | 5/2008 |
| JP | 2009-170676 | * | 7/2009 |
| JP | 2009-260191 | * | 11/2009 |
| KR | 10-0916931 |   | 9/2009 |

OTHER PUBLICATIONS

Notification of examiner's decision of refusal issued by the Korean Intellectual Property Office on Dec. 31, 2013, for Korean Patent Application No. 2012-0081182, and English-language translation thereof.

(Continued)

*Primary Examiner* — Robert M Kunemund
(74) *Attorney, Agent, or Firm* — Finnegan, Henderson, Farabow, Garrett & Dunner, L.L.P.

(57) ABSTRACT

A film-forming apparatus and method comprising a film-forming chamber for supplying a reaction gas, a cylindrical shaped liner provided in the film-forming chamber, a straightening vane provided above the liner for the reaction gas to pass through, wherein the outside of the film-forming chamber connects the inside of the liner via a substrate transfer portion provided at the wall of the film-forming chamber by moving the straightening vane from the position that the straightening vane closes the upper opening of the liner. A substrate supporting portion provided in the liner, for supporting the substrate before the film-forming to move the substrate in a vertical direction, a substrate transfer unit capable of moving inside the film-forming chamber through the substrate transfer portion, wherein the substrate is transferred between the substrate supporting portion and the substrate transfer unit.

12 Claims, 4 Drawing Sheets

(56) References Cited

OTHER PUBLICATIONS

Reasons for Refusal Notice issued by the Japanese Patent Office on Mar. 3, 2015, for Japanese Patent Application No. 2011-173086, and English-language translation thereof.

Notification of Reasons for Refusal issued by the Korean Intellectual Property Office on Jun. 25, 2013, for Korean Patent Application No. 2012-0081182, and English-language translation thereof.

\* cited by examiner

FILM-FORMING APPARATUS AND METHOD

CROSS-REFERENCE TO THE RELATED APPLICATION

The entire disclosure of the Japanese Patent Application No. 2011-173086, filed on Aug. 8, 2011 including specification, claims, drawings, and summary, on which the convention priority of the present application is based, are incorporated herein in its entirety.

FIELD OF THE INVENTION

The present invention relates to a film-forming apparatus and method.

BACKGROUND

Epitaxial growth technique is conventionally used to produce a semiconductor device such as a power device (e.g., IGBT (Insulated Gate Bipolar Transistor)) requiring a relatively thick crystalline film.

In the case of vapor phase epitaxy used in an epitaxial growth technique, a wafer is placed inside a film-forming chamber maintained at an atmospheric pressure or a reduced pressure, and a reaction gas is supplied into the film-forming chamber while the wafer is heated. As a result of this process, a pyrolytic reaction or a hydrogen reduction reaction of the reaction gas occurs on the surface of the wafer so that an epitaxial film is formed on the wafer. The gas generated by the reaction, as well as the gas not used, is exhausted through the outer portion of the chamber. After the epitaxial film is formed on the wafer, the substrate is carried out from the chamber. Another substrate is then placed into the chamber, and then an epitaxial film will be formed on that substrate.

In order to produce a thick epitaxial film in high yield, a fresh reaction gas needs to be continuously brought into contact with the surface of a uniformly heated wafer to increase a film-forming rate. Therefore, in the case of a conventional film-forming apparatus, a film is epitaxially grown on a wafer while the wafer is rotated at a high speed (see, for example, Japanese Patent Application Laid-Open No. 2008-108983).

FIG. 4 is a schematic sectional view showing the structure of a conventional film-forming apparatus using an epitaxial growth technique. It refers to a state in which the substrate is carried out (or placed into) the chamber.

As shown in FIG. 4, a film-forming chamber 201 has a belljar-shaped body 302 arranged on a base plate 301 in the film-forming apparatus 200. A base plate cover 303 is arranged and is detachable from the base plate 301. The base plate cover 303 has a shape and size that can cover the whole of the base plate 301.

The base plate cover 303 may consist of, for example, quartz. The base plate 301 is connected to the belljar-shaped body 302 via a flange 210. The flange 210 is sealed with packing 211. During the vapor-phase growth reaction, the temperature will be very high in the film-forming chamber 201. Therefore, flow channels 203 for circulating cooling water are provided in and around the periphery of the chamber 201 to prevent the thermal deterioration of the flange 210 and pipe 212 (which will be described later).

A supply portion 205 for supplying a reaction gas 204 is positioned in the belljar-shaped body 302. The discharge portion 206 is positioned in the base plate 301. The resulting process gas, after the reaction, and the process gas not used in the reaction are exhausted out of the film-forming chamber 201 through the discharge portion 206.

The discharge portion 206 is connected to a pipe 212 via the flange 210. The flange 210 is sealed with packing 214.

A liner 202 is positioned in the film-forming chamber 201. A rotating shaft 216 and a rotating cylinder 217 positioned on the top of the rotating shaft 216 are arranged in the liner 202. A susceptor 208 is attached to the rotating cylinder 217. The rotating shaft is rotated and as a result the susceptor 208 will rotate via the rotating cylinder 217. During the vapor-phase growth reaction, a substrate 207 is placed on the susceptor 208, and then the substrate 207 will be rotated with the rotation of the susceptor 208.

The liner 202 includes an upper opening into which a shower plate 215 is fitted to act as a gas straightening vane having the function of uniformly supplying the reaction gas 204 onto the surface of the semiconductor substrate 207. The reaction gas 204 flows through the shower plate 215 and flows downward toward the surface of the substrate 207. As a result, a pyrolytic reaction or a hydrogen reduction reaction occurs on the surface of the substrate 207 so that an epitaxial film is formed on the surface of the substrate 207.

The substrate 207 is heated by a heater 209 positioned in the rotating cylinder. The heater 209 is supported by an electrically conductive arm-like busbar 220. The busbar 220 is supported by the heater base 221 positioned at the opposite side of the heater 209, the busbar 220 and a rod electrode 223 are connected by the connecting portion 222. Electricity is conducted from rod electrodes 223 through the busbar 220 to the heater 209. The temperature of the substrate 207 is measured by a radiation thermometer 224a, 224b.

After the epitaxial film is formed, the process gas in the film-forming chamber 201 is replaced with hydrogen gas or inert gas. The substrate 207 is then carried out the film-forming chamber 201.

The liner 202 has a substrate transfer port 246 and the belljar-shaped body 302 has a substrate transfer port 247. A transfer chamber (not shown) is adjacent to the film-forming chamber 201. When the substrate 207 is carried out the film-forming chamber 201, the substrate 207 is moved upwards by a substrate supporting portion (not shown) in the rotating cylinder 217. A transfer arm 248 of a transfer robot is inserted into the film-forming chamber 201 via the substrate transfer ports 246 and 247. The substrate 207 is then transferred from the substrate supporting portion to the transfer arm 248, and carried out the film-forming chamber 201 through the substrate transfer ports 246 and 247.

When the next substrate 207, on which an epitaxial film would be formed, is carried into the film-forming chamber 201, the transfer arm 248 with the substrate 207 placed upon is inserted into the film-forming chamber 201 through the substrate transfer port 246 and 247. Next, the substrate 207 is transferred from the transfer arm 248 to the substrate supporting portion. The position of the substrate supporting portion is lowered, as a result, the substrate 207 is placed on the susceptor 208.

In a conventional film-forming apparatus 200 the following problems can occur.

The reaction gas 204 passes through the shower plate 215 into the inside of the liner 202 and flows downward toward the surface of the substrate 207. The liner 202 includes the substrate transfer port 246 connected to the substrate transfer port 247. The reaction gas 204 enters into this space formed by the transfer ports 246 and 247 (see FIG. 4) hereinafter referred to as the space C. As a result, it takes a long time for the gas to completely exit after epitaxial film-forming.

It is a possibility to introduce inert gas from the side of the substrate transfer port 247 to prevent the reaction gas 204 remaining in the space C. However, there are concerns that the efficiency of the epitaxial reaction will change as a result of the inert gas.

If the substrate 207 used is large in diameter, accordingly the space C tends to be large. In this situation the amount of reaction gas 204 in the space C increases. Therefore, the above-mentioned problem will become more serious.

The present invention has been made to address these issues. That is, an object of the present invention is to provide a film-forming apparatus and a film-forming method that can reduce the possibility of the reaction gas entering and remaining in the space.

Other challenges and advantages of the present invention are apparent from the following description.

SUMMARY OF THE INVENTION

The present invention relates to a film-forming apparatus and method for forming a film on a substrate.

In the first embodiment of this invention, a film-forming apparatus comprising: a film-forming chamber for supplying a reaction gas, a substrate transfer portion provided in the wall of the film-forming chamber, a cylindrical shaped liner provided in the film-forming chamber, a straightening vane provided above the liner for the reaction gas to pass through, wherein the outside of the film-forming chamber connects to the inside of the liner via the substrate transfer portion provided in the wall of the film-forming chamber, as a result of moving the straightening vane upwards from the position of the straightening vane closing the upper opening of the liner.

Further to the first embodiment of this invention, a film-forming apparatus, further comprising: a substrate supporting portion provided in the liner, for supporting the substrate for film-forming, and capable of moving the substrate in a vertical direction, a substrate transfer unit capable of transferring the substrate inside the film-forming chamber through the substrate transfer portion, wherein the substrate is transferred between the substrate supporting portion and the substrate transfer unit.

Further to the first embodiment of this invention, a film-forming apparatus, further comprising: a susceptor provided in the film-forming chamber to place the substrate thereon, a rotating unit that rotates the susceptor.

Further to the first embodiment of this invention, a film-forming apparatus, further comprising: a heater located below the susceptor.

Further to the first embodiment of this invention, a film-forming apparatus, further comprising: a heating unit having a first heater for heating the substrate and a second heater for heating the periphery of the substrate.

Further to the first embodiment of this invention, a film-forming apparatus, further comprising: a radiation thermometer provided outside the film-forming chamber to measure a temperature of the substrate by receiving radiant light from the substrate.

Further to the first embodiment of this invention, a film-forming apparatus, further comprising: a radiation thermometer having a first radiation thermometer for measuring a temperature of the center position of the substrate, and a second radiation thermometer for measuring a temperature of the periphery of the substrate.

In the second embodiment of this invention, a method for forming a film onto a surface of a substrate, the method comprising: transferring the substrate from outside a film-forming chamber into a cylindrical shaped liner in the film-forming chamber via a substrate transfer portion provided in the wall of the film-forming chamber and placing the substrate at the predetermined position, wherein the substrate transfer portion is opened as a result of moving a straightening vane in an upwards direction, supplying a reaction gas into the film-forming chamber, introduced into the liner via the straightening vane positioned above the liner, wherein the straightening vane has been lowered thus closing the substrate transfer portion, supplying the reaction gas into the liner via the straightening vane, forming a predetermined film on the substrate.

Further to the second embodiment of this invention, a method for forming a film, comprising: connecting the outside of the film-forming chamber to the inside of the liner via the substrate transfer portion provided in the wall of the film-forming chamber, as a result of moving the straightening vane in an upwards direction, moving the substrate upwards by a substrate supporting portion provided in the liner, after the film has been formed, transferring the substrate from the substrate supporting portion to a substrate transfer unit that is inserted from the substrate transfer portion to the film-forming chamber, transferring the substrate out of the film-forming chamber.

Further to the second embodiment of this invention, a method for forming a film, wherein the substrate supporting unit which is holding the substrate is moved from the substrate transfer portion to the film-forming chamber, transferring the substrate to the substrate supporting portion provided in the liner to transfer the substrate into the liner.

Further to the second embodiment of this invention, a method for forming a film, wherein the reaction gas is introduced into the film-forming chamber, in which the substrate is being rotated and heated, to perform film formation.

Further to the second embodiment of this invention, a method for forming a film, wherein the film is formed on the substrate while the substrate is heated by a heater provided below the substrate.

DETAILED DESCRIPTION OF THE INVENTION

Figure 1:
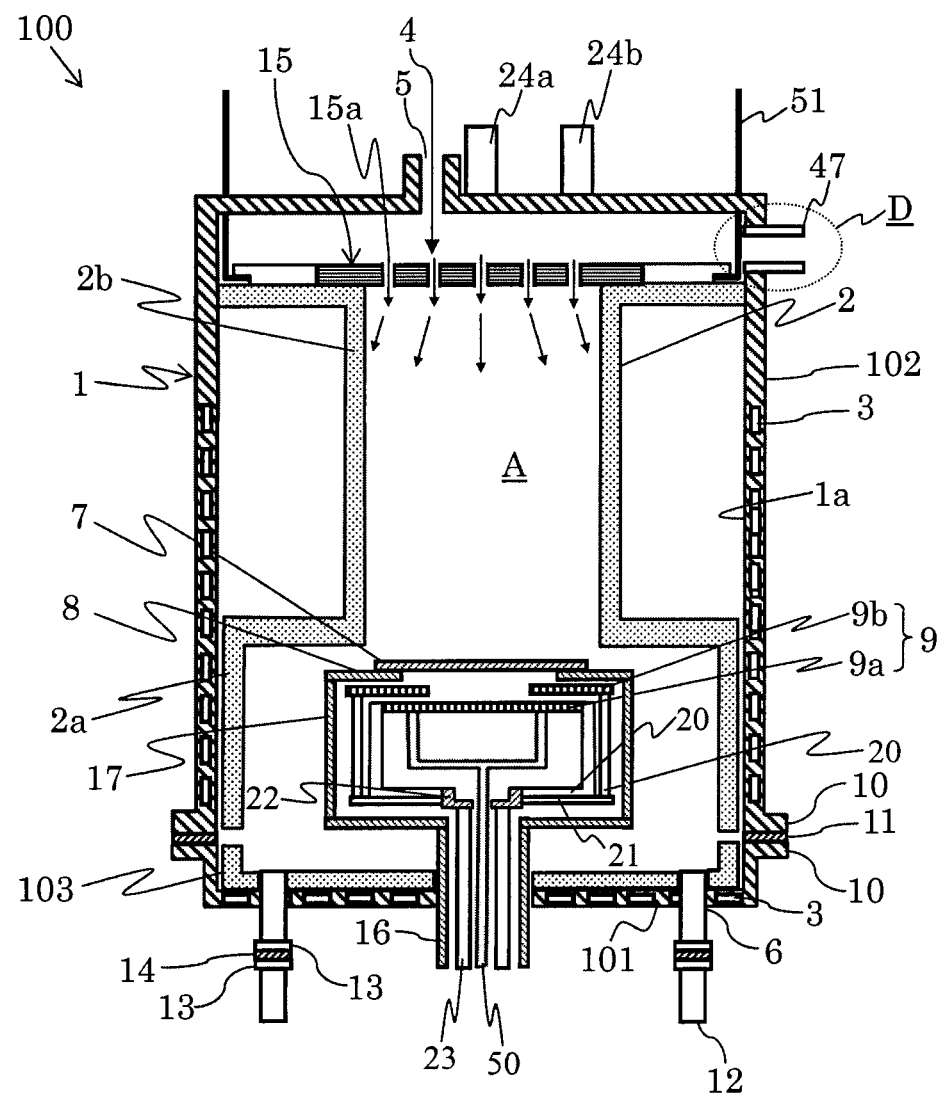
FIG. 1 is a schematic cross-sectional view of the film-forming apparatus according to the present embodiment.

FIG. 1 is a schematic cross-sectional view of a film-forming apparatus according to the present embodiment. In this drawing, some components are omitted with the exception of necessary components to explain the present embodiment. The scale of this drawing is also different from an actual apparatus so that each component is clearly visible.

As shown in FIG. 1, a film-forming apparatus 100 includes a film-forming chamber 1. The film-forming chamber has a belljar-shaped body 102 positioned on the base plate 101. A base plate cover 103 is provided and is detachable from the base plate 101, the base plate cover 103 has a shape and size which can cover the whole of the base plate 101.

The material of the base plate cover 103 consists of, for example, quartz. The base plate 101 is connected with the belljar-shapedbody 102 via a flange 10. The flange 10 is sealed with packing 11. The base plate 101 is made of, as one example, stainless steel.

During the vapor-phase growth reaction, the temperature will be very high in the film-forming chamber 1. Therefore, flow channels 3 allow cooling water to cool the film-forming chamber 1 are arranged in the base plate 101 and the belljar-shaped body 102.

The belljar-shaped body 102 has a supply portion 5 for supplying a reaction gas 4. The base plate 101 has a discharge portion 6. The process gas after the reaction and the process gas not reacted, are exhausted through the discharge portion 6 provided in the lower section of the chamber 1.

The discharge portion 6 is connected with a pipe 12 via the flange 13. The flange 13 is sealed by packing 14. Packing 11, 14 consist of, for example, fluorine-containing rubber having a capacity for resisting heat of up to approximately 300° C.

A hollow column-shaped liner 2 is positioned in the film-forming chamber 1. The liner 2 is arranged between an inner wall 1a of the film-forming chamber 1 and a space A in which the vapor-phase growth reaction is performed on the substrate 7. The liner 2 prevents the inner wall 1a from being damaged by the reaction gas 4. As the vapor-phase growth reaction is performed at high temperature, the liner 2 should consist of materials having a high capacity for resisting heat, for example, SiC or carbon-coated SiC.

In the present embodiment, the liner 2 is separated into body portions 2a and a top portion 2b for convenience of explanation. The top portion 2a is a part in which the susceptor 8 is placed. The top portion 2b has a smaller inner diameter than the body portion 2a. The liner 2 consists of the body portion 2a and the top portion 2b combined into one body. The top portion 2b is arranged above the body portion 2a.

The shower plate 15 is fitted into the upper opening of the top portion 2b. The shower plate 15 functions as a flow-straightening vane to uniformly supply the reaction gas 4 to the surface of the substrate 7. The shower plate 15 has a plurality of through-holes 15a. When the reaction gas 4 is supplied from the supply portion 5 into the film-forming chamber 1, the reaction gas 4 flows downward towards the substrate 7 via the through-holes 15a. It is preferable that the reaction gas 4 can be efficiently focused on the surface of the substrate 7 without wastage. Accordingly, the inner diameter of the top portion 2b is laid out so as to be smaller than the body portion 2a. Specifically, the inner diameter of the top portion 2b is determined in consideration of the position of the through-holes 15a and the size of the substrate 7.

The susceptor 8 for supporting the substrate 7 is positioned in the film-forming chamber 1, specifically, in the body portion 2a of the liner 2. In order to form a SiC epitaxial film, the temperature of the substrate 7 needs to be increased to 1500° C. or higher. For this reason, the susceptor 8 needs to be made of highly heat-resistant material. More specifically, one obtained by coating the surface of isotropic graphite with SiC by CVD (Chemical Vapor Deposition) is used (as one example). The shape of the susceptor 8 is not particularly limited as long as the substrate 7 can be placed on the susceptor 8. Examples can include a ring shape and a solid disk shape.

The substrate 7 is heated by the heater 9 positioned in the rotating cylinder 17. The heater 9 can be a resistive heater, and has a disk shaped in-heater 9a and a ring shaped out-heater 9b. The in-heater 9a is placed at the position corresponding to the substrate 7. The out-heater 9b is placed above the in-heater 9a, and at the position corresponding to outer peripheral of the substrate 7. As a result of the gas flow the temperature of the outer periphery of the substrate 7 is lower than the inner periphery, the outer heater 9b can be used to prevent a drop in temperature of the outer periphery.

The in-heater 9a and the out-heater 9b are supported by an electrically conductive arm-like busbar 20. The busbar 20 is made of, for example, a SiC-coated carbon material. The busbar 20 is supported by the heater base 21 made of quartz, at the opposite side of the in-heater 9a and the out-heater 9b. The busbars 20 are connected by the connecting portions 22. The connecting portions 22 are formed of a metal such as molybdenum. Electricity can be conducted from rod electrodes 23 through the busbars 20 to the in-heater 9a and the out-heater 9b. Specifically, electricity is conducted from the rod electrodes 23 to a heat source of the in-heater 9a and the out-heater 9b, and then the temperature of the heat source will increase.

The surface temperature of the substrate 7 is measured by radiation thermometers 24a and 24b. In FIG. 1, the temperature at the center of the substrate 7 is measured by the radiation thermometer 24a. The temperature of outer of the substrate 7 is measured by the radiation thermometer 24b. These radiation thermometers are arranged at the upper position of the film-forming chamber 1 as shown in FIG. 1. It is preferred that the upper portion of the belljar-shaped body 102 and the shower plate 15 be formed of quartz, because the use of quartz prevents them affecting the temperature measurement of the radiation thermometers 24a and 24b.

After temperature measurement, the data of the measurement is sent to a control device (not shown) and then fed back to an output control device of the in-heater 9a and the out-heater 9b. For example, each temperature of the heaters can be set as follows when a SiC epitaxial film is formed on the substrate 7, the substrate 7 can be heated to approximately 1650° C.:
Temperature of in-heater 9a: 1680° C.
Temperature of out-heater 9b: 1750° C.

The rotating shaft 16, and the rotating cylinder 17 positioned on the top of the rotating shaft 16 are located in the body portion 2a of the liner 2. The susceptor 8 is attached to the rotating cylinder 17. The rotating shaft 16 is rotated, and then the susceptor 8 is rotated via the rotating cylinder 17. When the vapor-phase growth reaction is performed, the substrate 7 is placed on the susceptor 8, and then the substrate 7 is rotated with the susceptor 8.

The reaction gas 4 passes through the shower plate 15, and flows downward toward the substrate 7 via the top portion 2b. The reaction gas 4 is attracted by the substrate 7 while the substrate 7 is rotating, and the reaction gas 4 forms a so-called vertical flow in a region extending from the shower plate 15 to the surface of the substrate 7. When the reaction gas 4 reaches the substrate 7, the reaction gas 4 flows without turbulence as a substantially laminar flow in a horizontal direction along the upper surface of the substrate 7. As described above, the reaction gas 4 then comes into contact with the surface of the substrate 7. Then, an epitaxial film is formed on the surface of the substrate 7 by a pyrolytic reaction or a hydrogen reduction of the reaction gas 4 on the surface of the substrate 7. The film-forming apparatus 100 is configured so that the gap between the periphery of the substrate 7 and the liner 2 is minimized to allow the reaction gas 4 to flow more uniformly onto the surface of the substrate 7.

According to the above-mentioned apparatus, the vapor-phase growth reaction can be performed while the substrate 7 is heated and rotated. The reaction gas 4 can be efficiently supplied on the whole surface of the substrate 7, and then an epitaxial film having high thickness uniformity can be formed. The film-forming rate can be increased when reaction gas 4 is continuously supplied to the surface of the substrate 7.

The reaction gas not used for the vapor-phase growth reaction, and the gas produced by the vapor-phase growth reaction, is exhausted from the discharge portion 6 of the base plate 101.

In the film-forming apparatus 100 the shower plate 15 is movable from the position wherein the shower plate 15 closes the upper opening (see symbol 52 in FIG. 2) of the liner 2 as shown in FIG. 1. The substrate transfer portion 47 used for transporting the substrate 7 in the belljar-shaped body 102 is positioned in the upper position of the liner 2. According to this construction, the film-forming apparatus 100 doesn't require an opening for transporting the substrate 7 into the liner 2. Therefore, there is no space C extending from the substrate transfer portion 47 of the liner 2 to the substrate transfer portion 47 of the belljar-shaped body 102, as a result the amount of space where a stasis occurs is reduced. This is described bellow in detail.

Figure 2:
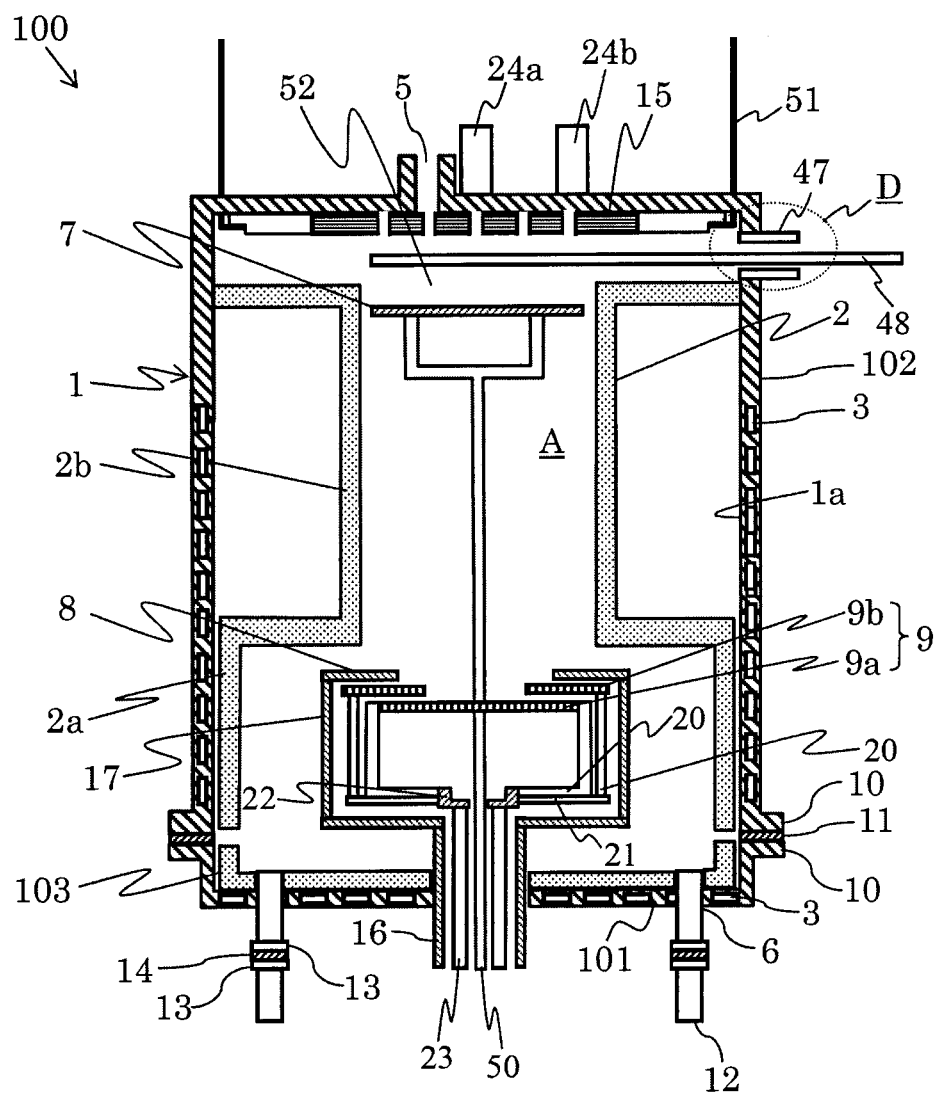
FIG. 2 shows a state of the shower plate moving in a film-forming apparatus according to the present embodiment.

While the vapor-phase growth reaction is performed in the film-forming chamber 1, the shower plate 15 is in contact with the upper surface of the top portion 2b of the liner 2. After the vapor-phase growth reaction is finished, the position of the shower plate 15 is moved in an upward direction by a supporting portion 51. FIG. 2 shows the state of the shower plate 15 moved. The outside of the film-forming chamber 1 connects the inside of the liner 2 via the substrate transfer portion 47 at the wall of the belljar-shaped body 102.

The film-forming chamber 1 is adjacent to and connecting with the transfer chamber (not shown) via the substrate transfer portion 47. The transfer robot for transferring the substrate 7 is positioned in the transfer chamber. Though the entire transfer robot is not shown it is, as one example, a spherical shaped robot which has a rotating axis which can be rotated around the Z axis crossing X axis and Y axis at right angles, a robot arm which is moveable along an horizontal axis in a coordinate system of the rotating axis, and a transfer arm at the end of the robot arm. In FIG. 2, the symbol 48 shows the transfer arm of the transfer robot, corresponding to the substrate transfer portion 47 in the present invention.

In FIG. 1, the substrate supporting portion 50 is arranged in the rotating cylinder 17 and is vertically movable. The substrate supporting portion 50 is moved up to come into contact with the substrate 7, and then move the substrate upwards.

Figure 3:
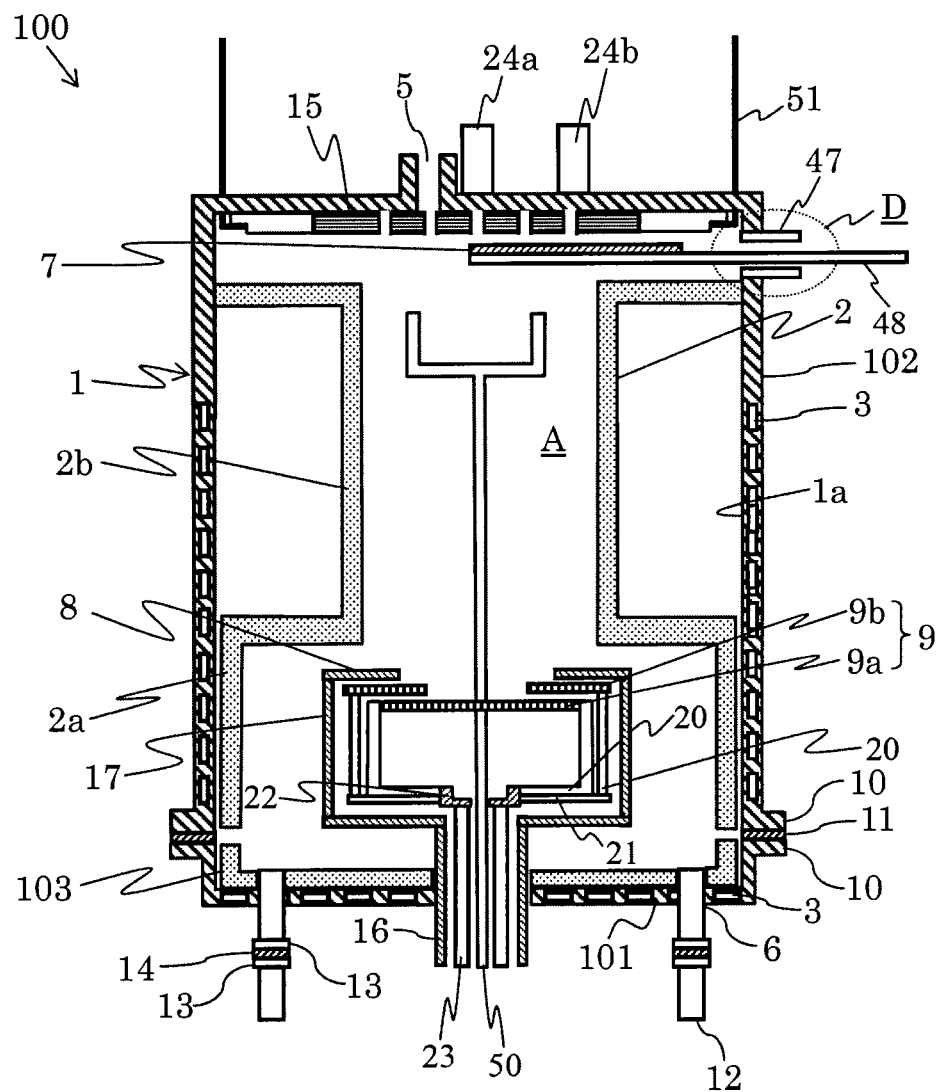
FIG. 3 shows a state of the substrate transferred from the substrate supporting portion to the transfer arm in a film-forming apparatus according to the present embodiment.

FIG. 3 shows the substrate 7 after being moved from the substrate supporting portion 50 to the transfer arm 48. The substrate 7 is supported by the transfer arm 48 and is transferred from the substrate transfer portion 47 to the outside of the film-forming chamber 1.

According to the film-forming apparatus 100 in the present embodiment, the shower plate 15 moves upwards, thereby allowing the substrate transfer portion 47 of the belljar-shaped body 102 to connect with the inside of the liner 2. The film-forming apparatus 100 doesn't need to have a substrate transfer portion 47 in the liner 2. Therefore it can minimize the space in which the reaction gas makes a stasis. That is, the time required for replacing the gas after the epitaxial film is formed, can be shorter than the conventional film-forming apparatus.

Further according to the present embodiment, the film-forming apparatus 100 doesn't need to be supplied with an inert gas to prevent the reaction gas 4, as seen in FIG. 1, from remaining in the space. Therefore, the fluctuations of the optimum condition of the vapor-phase growth reaction can be controlled.

In the present embodiment, even if the diameter of the substrate 7 is large, the film-forming apparatus 100 doesn't need to have a substrate transfer portion 47 in the liner 2. Therefore it won't change the effect for decreasing the stasis of the reaction gas 4.

Next, an example of the film-forming method in the present embodiment is described referring to FIG. 1, FIG. 2 and FIG. 3.

The film-forming apparatus 100 according to the present embodiment is preferable for forming a SiC epitaxial film. The below-mentioned regarding the SiC epitaxial film-forming is one example.

For example, a SiC wafer can be used as the substrate 7. However, the substrate 7 is not limited to a SiC wafer. The material of the substrate 7 may be, for example, Si, $SiO_2$ (quartz) or another insulator. A highly resistive semi-insulating substrate such as GaAs (gallium arsenide) can also be used.

As a reaction gas 4, for example, propane ($C_3H_8$) or silane ($SiH_4$) is used. Hydrogen gas is used as the carrier gas. In the case of the reaction gas 4, disilane ($SiH_5$), monochlorosilanes ($SiH_3Cl$), dichlorosilane ($SiH_2Cl_2$), torichlorosilane ($SiHCl_3$) or tetrachlorosilane ($SiCl_4$) can also be used instead of silane.

Firstly, the substrate 7 is placed on the susceptor 8.

Next, the substrate 7 is rotated at atmospheric pressure or under an appropriate reduced vacuum pressure. The susceptor 8 on which the substrate 7 is placed, is positioned on the upper end of the rotating cylinder 17. When the rotating cylinder 17 is rotated via the rotating shaft 16, the susceptor 8 is rotated via the rotating cylinder 17, and consequently the substrate 7 can be rotated via the susceptor 8. The number of revolutions of the substrate 7 can be rotated at approximately 50 rpm.

Then, the substrate 7 is heated by the heater 9. During the vapor-phase growth reaction, the substrate 7 is heated at the predetermined temperature, for example, between 1500° C. and 1700° C. At this time, an excessive increase in the temperature of the film-forming chamber 1 can be prevented by allowing cooling water to flow through the channel 3 provided in the base plate 101 and through the wall of the belljar-shaped body 102.

After it is confirmed that the temperature of the substrate 7 measured by the radiation thermometer 24a, 24b has reached a predetermined temperature, for example 1650° C., the number of revolutions of the substrate 7 is gradually increased. For example, the number of revolutions of the substrate 7 can be increased to 900 rpm. The reaction gas 4 is supplied from the supply portion 5, the shower plate 15 is placed at the position which covers the upper opening 52 of the liner 2, that is, which contacts the top of the surface of the top portion 2b of the liner 2.

Figure 4:
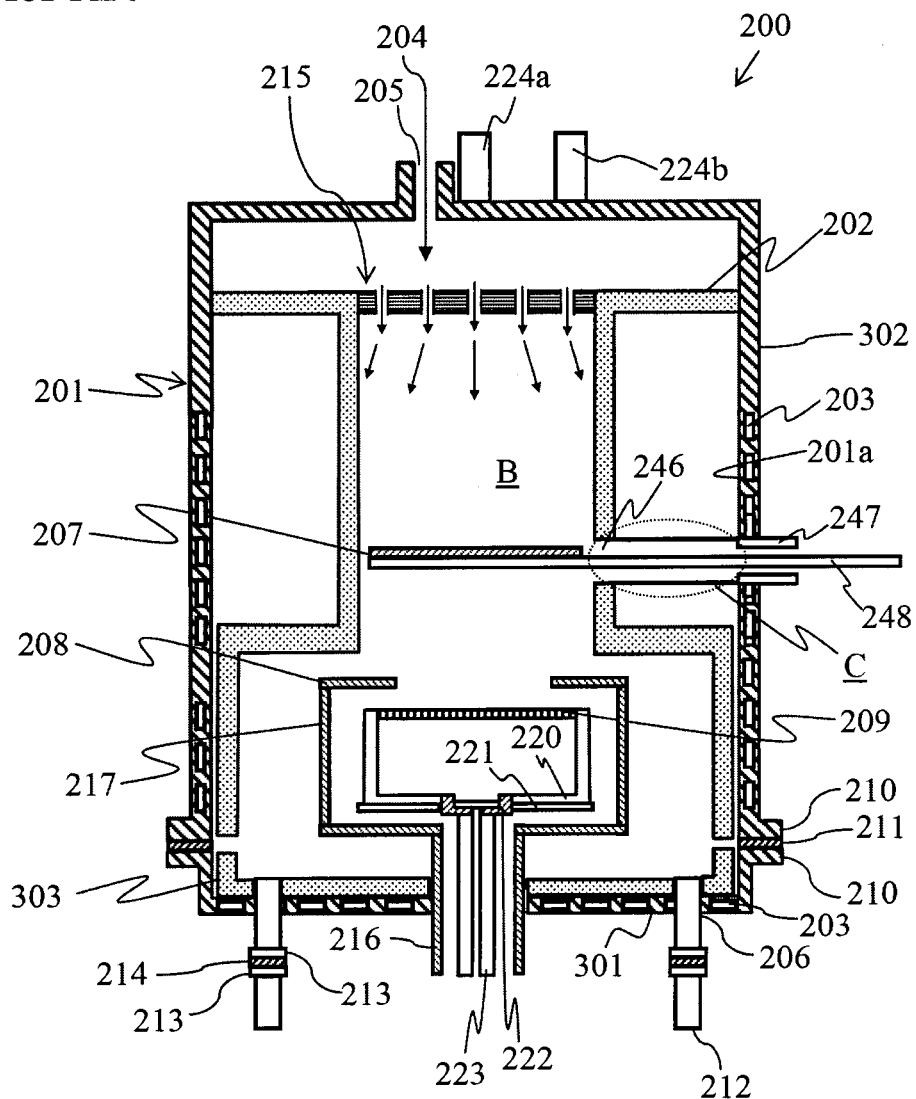
FIG. 4 is a schematic cross-sectional view of a conventional film-forming apparatus.

The reaction gas 4 passes via the through-holes 15a of the shower plate 15, and then flows into the space A in which the vapor-phase growth reaction will be performed on the substrate 7. At this time, the flow of the reaction gas 4 is straightened by passing the gas through the shower plate 15 serving as a straightening vane so that the reaction gas 4 flows substantially vertical downward toward the substrate 7 placed under the shower plate 15. That is, the reaction gas 4 forms a so-called vertical flow. As the liner 2 doesn't have a substrate transfer portion for transferring the substrate 7, there is no part like the space C in the conventional film-forming apparatus 200 shown in FIG. 4. The top portion 2b of the liner 2 is ideally a cylindrical shape. Accordingly the reaction gas 4 reaches the substrate 7 without the gas remaining in the space C.

When the reaction gas 4 reaches the surface of the substrate 7, a thermal decomposition reaction or a hydrogen reduction reaction occurs so that a SiC epitaxial film is formed on the surface of the substrate 7. Surplus reaction gas 4 that wasn't used for the vapor-phase growth reaction, and gas generated by the vapor-phase growth reaction, is discharged through the discharge portion 6 provided in the lower part of the film-forming chamber 1.

After forming a SiC film of a predetermined thickness on the substrate 7, the supply of reaction gas 4 is stopped. The gas in the film-forming chamber 1 is replaced with hydrogen gas, an inert gas and so on. The supply of the carrier gas can also be stopped at the same time, alternatively, after only the supply of the reaction gas 4 is stopped, the supply of the carrier gas can be stopped after the temperature of the substrate 7 as measured by the radiation thermometer 24a and 24b becomes lower than a predetermined temperature.

After the temperature of the substrate 7 as measured by the radiation thermometer 24a and 24b is cooled to a predetermined temperature, the substrate 7 is moved out of the film-forming chamber 1.

Specifically the shower plate 15 is moved upwards by the supporting portion 51 as shown FIG. 2. Thereby causing the inside of the liner 2 to connect with the outside of the film-forming chamber 1 via the substrate transfer portion 47 provided in the belljar-shaped body 102.

The substrate supporting portion 50 shown in FIG. 1, is moved upwards to contact the substrate 7, the substrate supporting portion 50 then moves the substrate further as shown in FIG. 2.

Next, the substrate 7 is transferred from the substrate transfer portion 50 to the transfer arm 48 as shown in FIG. 3. After that, the substrate 7 being held by the transfer arm 48 is transferred out of the film-forming chamber 1.

A new substrate 7 is transferred into the film-forming chamber 1 to form a new film.

Specifically, the transfer arm 48 holding the substrate 7 is inserted through the substrate transfer portion 47 into the film-forming chamber 1. Then the substrate 7 is transferred from the transfer arm 48 to the substrate supporting portion 50. After that, the transfer arm 48 is removed from the substrate transfer portion 47 out of the film-forming chamber 1.

Next, the shower plate 15 is moved in a downward direction by the supporting portion 51, to contact with the upper surface of the top portion 2b of the liner 2. The substrate supporting portion 50 is also moved downward to place the substrate 7 on the susceptor 8. After that, the epitaxial film will be formed on the substrate 7 according to the above method.

In the present embodiment, the substrate transfer portion 47 provided in the belljar-shaped body 102 connects the inside of the liner 2 via the space D by moving the shower plate 15 from the position of the used during film-forming, and the substrate 7 is transferred via the space D. According to this method, the film-forming apparatus 100 doesn't need to have a substrate transfer portion 47 in the liner 2. Therefore, we can reduce the amount of space where a stasis can occur. As a result, the time for replacing the gas after the epitaxial film is formed, can be shorter than the conventional film-forming apparatus.

Further, according to the present embodiment, an inert gas doesn't need to be supplied to prevent the reaction gas 4 from remaining in the space. Therefore, the fluctuations in the condition of the vapor-phase growth reaction can be controlled.

Features and advantages of the present invention can be summarized as follows.

According to the first embodiment, a flow-straightening vane is moved to a position covering the upper opening of the liner. Accordingly, the outside of the film-forming chamber is connected to the inside of the liner via the substrate transfer port arranged in the wall of the film-forming chamber. Thereby, the space in which the reaction gas makes a stasis can be minimized.

According to the second embodiment, a flow-straightening vane is moved to a position covering the upper opening of the liner. Accordingly, the substrate is transferred between the outside of the film-forming chamber and the inside of the liner through the substrate transfer port arranged in the wall of the film-forming chamber. Thereby the space in which the reaction gas makes a stasis can be minimized.

The present invention is not limited to the embodiments described and can be implemented in various ways without departing from the spirit of the invention. For example, the above embodiment has been described as an example of a film-forming process while rotating the substrate in a film-forming chamber, the present invention is not limited to this. The film-forming apparatus of the present invention may be deposited on the substrate while not rotating.

In addition to the above embodiments, an epitaxial growth system cited as the example of a film-forming apparatus for forming SiC film in the present invention is not limited to this. Reaction gas supplied into the film-forming chamber for forming a film on its surface while heating the wafer, can also be applied to other apparatus such as CVD (Chemical Vapor Deposition) film-forming apparatus, and for forming other epitaxial films.

The above description of the invention has not specified apparatus constructions, control methods, etc. which are not essential to the description of the invention, since any suitable apparatus constructions, control methods, etc, can be employed to implement the invention.

Further, the scope of this invention encompasses all film-forming apparatus employing these elements and variations thereof, which can be designed by those skilled in the art.

What is claimed is:

1. A film-forming apparatus comprising:
   a film-forming chamber configured to perform film-formation by a reaction gas supplied therein;
   a substrate transfer portion provided in the wall of the film-forming chamber;
   a cylindrical shaped liner provided in the film-forming chamber; and
   a straightening vane configured to pass through the reaction gas and supply the reaction gas into an inside of the cylindrical shaped liner when the straightening vane closes an upper opening of the cylindrical shaped liner,
   the straightening vane configured to move upward to bring the inside of the cylindrical shaped liner into communication with the substrate transfer portion.

2. The film-forming apparatus according to claim 1, comprising:
   a substrate supporting portion provided in the cylindrical shaped liner, for supporting a substrate for film-forming, and capable of moving the substrate in a vertical direction;
   a substrate transfer unit capable of transferring the substrate inside the film-forming chamber through the substrate transfer portion;
   wherein the substrate is transferred between the substrate supporting portion and the substrate transfer unit.

3. The film-forming apparatus according to claim 1, further comprising:
   a susceptor provided in the film-forming chamber to place a substrate thereon; and
   a rotating unit that rotates the susceptor.

4. The film-forming apparatus according to claim 3, further comprising:
a heater located below the susceptor.

5. The film-forming apparatus according to claim 4, further comprising:
the heater including a first heater for heating the substrate and a second heater for heating a periphery of the substrate.

6. The film-forming apparatus according to claim 1, further comprising:
a radiation thermometer provided outside the film-forming chamber to measure a temperature of a substrate by receiving radiant light from the substrate.

7. The film-forming apparatus according to claim 1, further comprising:
a radiation thermometer having a first radiation thermometer for measuring a temperature of a center position of a substrate, and a second radiation thermometer for measuring a temperature of a periphery of the substrate.

8. A method for forming a film onto a surface of a substrate, the method comprising:
moving upward a straightening vane provided above an upper opening of a cylindrical shaped liner in a film-forming chamber to bring an inside of the cylindrical shaped liner into communication with a substrate transfer portion provided in a wall of the film-forming chamber;
transferring the substrate from outside the film-forming chamber to within the cylindrical shaped liner;
placing the substrate at a predetermined position;
moving the straightening vane downward to close the upper the opening of the cylindrical shaped liner;
supplying a reaction gas into the inside of the cylindrical shaped liner via the straightening vane; and
forming a predetermined film on the substrate.

9. The method for forming a film according to claim 8, further comprising:
bringing the outside of the film-forming chamber into communication with the inside of the cylindrical shaped liner via the substrate transfer portion provided in the wall of the film-forming chamber by moving the straightening vane in an upward direction;
moving the substrate upward by a substrate supporting portion provided within the liner, after the film has been formed;
transferring the substrate from the substrate supporting portion to a substrate transfer unit that is inserted from the substrate transfer portion into the film-forming chamber; and
transferring the substrate out of the film-forming chamber.

10. The method for forming a film according to claim 8, comprising:
moving a substrate transfer unit, which is holding the substrate, from the substrate transfer portion into the film-forming chamber; and
transferring the substrate to a substrate supporting portion provided in the cylindrical shaped liner thus transferring the substrate into the inside of the cylindrical shaped liner.

11. The method for forming a film according to claim 8, wherein the reaction gas is introduced into the film-forming chamber, in which the substrate is being rotated and heated, to perform film formation.

12. The method for forming a film according to claim 11, wherein the film is formed on the substrate while the substrate is heated by a heater provided below the substrate.

* * * * *